United States Patent [19]

Guha et al.

[11] Patent Number: 4,609,771

[45] Date of Patent: * Sep. 2, 1986

[54] TANDEM JUNCTION SOLAR CELL DEVICES INCORPORATING IMPROVED MICROCRYSTALLINE P-DOPED SEMICONDUCTOR ALLOY MATERIAL

[75] Inventors: Subhendu Guha, Clawson; James Kulman, Detroit, both of Mich.

[73] Assignee: Sovonics Solar Systems, Troy, Mich.

[*] Notice: The portion of the term of this patent subsequent to Jul. 15, 2003 has been disclaimed.

[21] Appl. No.: 701,320

[22] Filed: Feb. 13, 1985

Related U.S. Application Data

[63] Continuation-in-part of Ser. No. 667,659, Nov. 2, 1984.

[51] Int. Cl.[4] ............................................. H01L 31/06
[52] U.S. Cl. .................... 136/249; 136/258; 357/30; 357/59
[58] Field of Search .................... 136/249 TJ, 258 PC, 136/258 AM; 357/30, 59 A, 59 D

[56] References Cited

U.S. PATENT DOCUMENTS

| | | | |
|---|---|---|---|
| 4,398,343 | 8/1983 | Yamazaki | 29/585 |
| 4,409,134 | 10/1983 | Yamazaki | 252/501.1 |
| 4,433,202 | 2/1984 | Maruyama et al. | 136/255 |
| 4,479,028 | 10/1984 | Sato et al. | 136/249 |
| 4,496,788 | 1/1985 | Maruyama et al. | 136/249 TJ |

OTHER PUBLICATIONS

Nakamura et al, *Tech. Digest Int'l PVSEC-1,* Kobe, Japan, Nov. 1984, pp. 587–590.
Nakamura et al, *J. Non-Crystalline Solids,* vol. 59–60, pp. 1111–1114 (1983).

*Primary Examiner*—Aaron Weisstuch
*Attorney, Agent, or Firm*—Marvin S. Siskind; Ronald W. Citkowski

[57] ABSTRACT

A p-doped microcrystalline silicon alloy material incorporated into a tandem photovoltaic device.

19 Claims, 5 Drawing Figures

TANDEM JUNCTION SOLAR CELL DEVICES INCORPORATING IMPROVED MICROCRYSTALLINE P-DOPED SEMICONDUCTOR ALLOY MATERIAL

CROSS-REFERENCE TO RELATED APPLICATIONS

This application is a continuation-in-part of U.S. patent application Ser. No. 667,659 filed Nov. 2, 1984.

FIELD OF THE INVENTION

This invention relates generally to thin film semiconductor alloys and more particularly to p-doped, microcrystalline semiconductor alloy material, as well as processes for manufacturing said alloy material and semiconductor devices incorporating said alloy material.

BACKGROUND OF THE INVENTION

Due to the fact that the instant patent application deals with semiconductor alloy materials which will be referred to by specialized definitions of amorphicity and crystallinity, it is necessary to particularly set forth those specialized definitions at the outset.

The term "amorphous", as used herein, is defined to include alloys or materials exhibiting long range disorder, although said alloys or materials may exhibit short or intermediate range order or even contain crystalline inclusions. As used herein the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap and absorption constant occurs. It is to be noted that pursuant to the foregoing definitions, the microcrystalline, p-doped semiconductor alloy material of the instant invention falls within the generic term "amorphous".

The concept of microcrystalline materials exhibiting a threshold volume fraction of crystalline inclusions at which substantial charges in key parameters occur, can be best understood with reference to the percolation model of disordered materials. Percolation theory, as applied to microcrystalline disordered materials, analogizes properties such as the electrical conductivity manifested by microcrystalline materials, to the percolation of a fluid through a non-homogeneous, semi-permeable medium sucn as a gravel bed.

Microcrystalline materials are formed of a random network which includes low conductivity, highly disordered regions of material surrounding randomized, highly ordered crystalline inclusions having high electrical conductivity. Once these crystalline inclusions attain a critical volume fraction of the network, (which critical volume will depend, inter alia, upon the size and/or shape and/or orientation of the inclusions), it becomes a statistical probability that said inclusions are sufficiently interconnected so as to provide a low resistance current path through the network. Therefore at this critical or threshold volume fraction, the material exhibits a sudden increase in conductivity. This analysis (as described in general terms relative to electrical conductivity herein) is well known to those skilled in solid state theory and may be similarly applied to describe additional physical properties of microcrystalline materials, such as optical gap, absorption constant, etc.

The onset of this critical threshold value for the substantial change in physical properties of microcrystalline materials will depend upon the size, shape and orientation of the particular crystalline inclusions, but is relatively constant for different types of materials. It should be noted that while many materials may be broadly classified as "microcrystalline", those materials will not exhibit the properties we have found advantageous for the practice of our invention unless they have a volume fraction of crystalline inclusions which exceeds the threshold value necessary for substantial change. Accordingly, we have defined "microcrystalline materials" to include only those materials which have reached the threshold value. Further note that the shape of the crystalline inclusions is critical to the volume fraction necessary to reach the threshold value. There exist 1-D, 2-D and 3-D models which predict the volume fraction of inclusions necessary to reach the threshold value, these models being dependent on the shape of the crystalline inclusions. For instance, in a 1-D model (which may be analogized to the flow of charge carriers through a thin wire), the volume fraction of inclusions in the amorphous network must be 100% to reach the threshold value. In the 2-D model (which may be viewed as substantially conically shaped inclusions extending through the thickness of the amorphous network), the volume fraction of inclusions in the amorphous network must be about 45% to reach the threshold value. And finally in the 3-D model (which may be viewed as substantially spherically shaped inclusions in a sea of amorphous material), the volume fraction of inclusions need only be about 16–19% to reach the threshold value. Therefore, amorphous materials (even materials classified as microcrystalline by others in the field) may include crystalline inclusions without being microcrystalline as that term is defined herein.

Amorphous thin film semiconductor alloys have gained growing acceptance as a material from which to fabricate electronic devices such as photovoltaic cells, photoresponsive and photoconductive devices, transistors, diodes, integrated circuits, memory arrays and the like. This is because the amorphous thin film semiconductor alloys (1) can be manufactured at relatively low cost, (2) possess a wide range of controllable electrical, optical and structural properties and (3) can be deposited to cover relatively large areas.

Recently, considerable effort has been expended to develop systems and processes for depositing amorphous semiconductor alloy materials which encompass relatively large areas and which can be doped so as to form p-type and n-type semiconductor alloy layers for the production therefrom of thin film electronic devices, particularly thin film p-n type and p-i-n type photovoltaic devices which would be substantially operatively equivalent or superior to their crystalline counterparts. Among the investigated semiconductor alloy materials of the greatest significance are the silicon, germanium, and silicon-germanium based alloys. Such semiconductor alloys have been the subject of a continuing development effort on the part of the assignee of the instant invention, said alloys being utilized and investigated as possible candidates from which to fabricate amorphous semiconductor, electronic and photresponsive devices.

As disclosed in U.S. Pat. No. 4,226,898 of Ovshinsky, et al, which patent is assigned to the assignee of the instant invention and the disclosure of which is incorporated herein by reference, fluorine introduced into the silicon alloy semiconductor layers operates to substantially reduce the density of the localized defect states in the energy gap thereof and facilitates the addition of other alloying materials, such as germanium. As a result of introducing fluorine into the host matrix of the semiconductor alloy, the film so produced can have a number of favorable attributes similar to those of single crystalline materials. A fluorinated thin film semiconductor alloy can thereby provide high photoconductivity, an increased number of charge carriers, low dark intrinsic electrical conductivity, and, where desired, such alloys can be modified to help shift the Fermi level to provide substantially n- or p-type extrinsic electrical conductivity. Thus, fluorinated thin film amorphous semiconductor alloy materials can be fabricated in a manner which allows them to act like crystalline materials and be useful in devices, such as, solar cells and current controlling devices including diodes, transistors and the like.

Unlike crystalline silicon which is limited to batch processing for the manufacture of solar cells, the aforedescribed amorphous silicon and germanium alloys can be deposited in multiple layers over large area substrates to form semiconductor devices in a high volume, continuous processing system, Such continuous processing systems are disclosed in the following U.S. Pat. Nos. 4,400,409, for A Method Of Making P-Doped Silicon Films and Devices Made Therefrom and No. 4,410,588, for Continuous Amorphous Solar Cell Production System; No. 4,438,723, for Multiple Chamber Deposition And Isolation System And Method. As disclosed in these patents, a substrate may be continuously advanced through a succession of interconnected, environmentally protected deposition chambers, wherein each chamber is dedicated to the deposition of a specific semiconductor material. In making a photovoltaic device, for instance, of p-i-n type configurations, the first chamber is dedicated for depositing a p-type semiconductor alloy, the second chamber is dedicated for depositing an intrinsic amorphous semiconductor alloy, and the third chamber is dedicated for depositing an n-type semiconductor alloy. The layers of semiconductor alloy material thus deposited in the vacuum envelope of the depostion apparatus may be utilized to form photoresponsive devices, such as, but not limited to photovoltaic cells which include one or more p-i-n type cells. Note that as used herein the term "p-i-n type" will refer to any sequence of p and n or p, i, and n semiconductor alloy layers. Additionally, by making multiple passes through the succession of deposition chambers, or by providing an additional array of deposition chambers, multiple stacked cells of various configurations may be obtained.

The concept of utilizing multiple stacked cells, to enhance photovoltaic device efficiency, was described at least as early as 1955 by E. D. Jackson in U.S. Pat. No. 2,949,498 issued Aug. 16, 1960. The multiple cell structures therein disclosed were limited to the utilization of p-n junctions formed by single crystalline semiconductor devices. Essentially, the concept employed different band gap devices to more efficiently collect various portions of the solar spectrum and to increase open circuit voltage (Voc). The tandem cell device (by definition) has two or more cells with the light directed serially through each cell. In the first cell, a large band gap material absorbs only the short wavelength light, while in subsequent cells, smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant. Such tandem cell structures can be economically fabricated in large areas by employing thin film amorphous, microcrystalline, and polycrystalline semiconductor alloy materials, such as the microcrystalline p-doped semiconductor alloy material of the instant invention.

It is now possible to manufacture high quality n-doped and intrinsic thin film semiconductor alloy layers utilizing techniques developed by the assignee of the instant invention. However, the p-doped thin film semiconductor alloy layers heretofore fabricated have, in many instances, been of less than the optimum quality required for the manufacture of the highest efficiency semiconductor alloy devices therefrom. Accordingly, because of the limitations imposed by the p-doped semiconductor alloy material, the optimum operational potential of many classes of thin film semiconductor alloy devices have as yet to be achieved.

We have recently discovered that if a highly transparent, wide band gap, microcrystalline, p-doped semiconductor alloy layer (also referred to as a highly "p-doped layer") could be fabricated, p-i-n and n-i-p type photovoltaic cells and particularly p-i-n and n-i-p tandem photovoltaic cells manufactured with said microcrystalline, p-doped semiconductor alloy layer will exhibit not only significant, but synergistic improvement in the operational performance thereof. Such a highly p-doped microcrystalline semiconductor alloy layer would have a low activation energy and would thus increase the magnitude of the electrical field established across the intrinsic semiconductor alloy layer by itself and the oppositely disposed n-doped layer, thereby improving the fill factor of the photovoltaic cell fabricated therefrom. Similarly, the built-in potential of the photovoltaic cells, and consequently, the open circuit voltage generated thereacross would be increased by the presence of the highly p-doped, microcrystalline, semiconductor alloy layer. Also, since the built-in potential is increased, charge carriers are more readily moved from the photoactive region in which they are generated to the respective electrodes despite the presence of photoinduced defects which are responsible for the well known effect of Staebler/Wronski degradation, thereby providing drastically improved stability. The improved electrical conductivity of microcrystalline p-doped semiconductor alloy material, vis-a-vis similarly constituted and doped semiconductor alloy material, which material is characterized by a number of crystalline inclusions below the aforementioned threshold value, would further provide for decreased series resistance encountered by charge carriers in their movement through the photovoltaic cell. The decrease in series resistance would result in improved fill factor and overall efficiency of that photovoltaic cell.

Wide band gap, p-doped microcrystalline semiconductor alloy layers are more optically transparent than corresponding amorphous semiconductor alloy layers which have a volume fraction of inclusions below the threshold value. We came to the analytical and theoretical conclusion that such transparency is desirable, if not essential, in the p-doped layer of a p-i-n type photovoltaic cell because the increased transparency will allow more light, whether incident upon the p-doped layer or redirected by a back reflector through that p-doped layer, to pass therethrough for absorption in the intrinsic semiconductor alloy layer (the photoactive region) of the photovoltaic cell. It is in this intrinsic semiconductor alloy layer that charge carrier pairs are most efficiently generated and separated. Therefore, photovoltaic cells employing microcrystalline, wide band gap, p-doped layers of semiconductor alloy material would also produce higher short circuit currents. This consideration of transparency would be especially significant for a tandem p-i-n type photovoltaic device, described hereinabove, which device is formed of a multiplicity of stacked, individual p-i-n type photovoltaic cells. This is because, we theorized, in such a tandem photovoltaic device, a light absorbing (narrow band gap) p-doped layer in (1) the upper photovoltaic cell would "shade" one or more of the underlying cells and thus reduce the amount of incident light absorbed in the intrinsic semiconductor alloy layer, the layer with the longest lifetime for charge carriers thereof, and (2) the lower photovoltaic cell would "shade" one or more of the superposed cells and thus reduce the amount of redirected light absorbed in the intrinsic semiconductor alloy layer.

We went on to hypothecate, if it would be possible to fabricate a microcrystalline p-doped semiconductor alloy material having a wide band gap, high electrical conductivity and low activation energy, said p-doped semiconductor alloy material would prove to be very beneficial in the manufacture of photovoltaic devices, especially tandem photovoltaic devices. Similarly, such a p-doped microcrystalline semiconductor alloy material could be advantageously employed in the manufacture of other electronic devices to complement the presently available high conductivity n-type thin film silicon alloy semiconductor material. Obviously, high quality, microcrystalline, p-doped semiconductor alloy materials would have immediate utility in the fabrication of a wide variety of thin film electronic devices such as thin film transistors, diodes, memory arrays and the like. Simply stated, such p-doped microcrystalline semiconductor alloy material could be made to exhibit the high conductivity and wide band gap characteristics of corresponding single crystal semiconductor material and could be made to accept sufficiently high levels of p-dopant material to provide a low activation energy. Further, such p-doped microcrystalline semiconductor alloy materials could be produced in a wide range of compositional variations by low cost vapor deposition techniques.

We are aware that microcrystalline alloy materials have been known for some time, and various reseachers have reported a wide variety of microcrystalline semiconductor alloy materials and methods for their fabrication. We are not implying that we have invented the concept of microcrystalline semiconductor material per se. However, we are claiming to have recognized the previously unrecognized facts that (1) the particularly advantageous properties exhibited by microcrystalline semiconductor alloy materials can be further enhanced by the inclusion of the "super-halogen" fluorine into the silicon:hydrogen semiconductor alloy matrix; and (2) microcrystalline semiconductor alloy materials (as we have described them hereinabove), with or without the addition of fluorine, have particular utility in the fabrication of n-i-p type photovoltaic devices, particularly tandem n-i-p photovoltaic devices, wherein said materials may be synergistically incorporated into the device structure to provide a photovoltaic device having uniquely high efficiency and stability. The importance of these two discoveries will be individually treated in the succeeding sections.

I. Microcrystalline Semiconductor Alloys

One method for the fabrication of microcrystalline p-doped silicon alloy materials is disclosed by Matsuda, et al in a paper entitled "High-Conductive And Wide Optical-Gap Boron-Doped Si:H Films" published in 1981 by the American Institute of Physics in *Tetrahedrally Bonded Amorphous Semiconductors*, edited by Street, Biegehem and Knights. As described therein, a glow discharge deposition technique is used for the preparation of thin films of boron doped, hydrogenated microcrystalline silicon alloy material from a gaseous precursor mixture of diborane, silane, and hydrogen under high power, low pressure conditions. The resultant p-doped semiconductor alloy was reported to have an optical gap of 1.8 eV, a dark conductivity of about 0.1 ohm$^{-1}$cm$^{-1}$, an activation energy of 0.03 eV, and microcrystalline inclusions amounting to 60 volume % in the amorphous network.

While the aforementioned paper of Matsuda, et al discloses a method for the preparation of microcrystalline, p-doped, hydrogenated silicon alloys, said alloys were not optimized for the production of the highest efficiency semiconductor devices therefrom. For instance, the conductivity of 0.1 ohm$^{-1}$cm$^{-1}$ remains far below (about at least two orders of magnitude below) the value that we have obtained with our fluorinated, microcrystalline p-doped hydrogenated silicon alloy material and the band gap remains narrower than the band gap of the corresponding intrinsic semiconductor alloy material (of course, the activation energy is partially dependent upon the conductivity and the activation energy directly effects the built-in potential of a device fabricated therefrom). We believe that the technique described by Matsuda, et al provides less than optimized semiconductor alloy material insofar as it (1) fails to incorporate fluorine into the host matrix of the semiconductor alloy material, (2) relies exclusively upon the use of diborane as the gaseous precursor material from which to provide boron for p-doping the semiconductor alloy material; and (3) fails to provide an optimized volume percentage of crystalline inclusions.

First, with respect to the use of diborane, we have discovered that while the fabrication of hydrogenated microcrystalline p-doped semiconductor alloy material is a notable achievement regardless of the gaseous precursor p-dopant material, the polymeric tendencies of a gaseous diborane precursor under the influence of a glow discharge environment would make it desirable, if possible, to substitute another gaseous precursor source of a p-dopant material. More particularly, (1) diborane is a relatively expensive, toxic, gaseous material which ignites spontaneously upon contact with the ambient atmosphere, thus necessitating the implementation of special production procedures and the use of expensive, specialized gas handling and storage systems, (2) under glow discharge conditions diborane inherently produces semiconductor species exhibiting less than desirable plasma properties. As fully disclosed in U.S. patent application Ser. No. 668,435 filed Nov. 5, 1984 of Yang, et al, which application is assigned to the assignee of the instant invention and the disclosure of which is incorporated herein by reference, diborane, under glow discharge deposition conditions, is characterized by a tendency to incorporate polymeric and oligomeric boron species into the depositing host matrix of the semiconductor alloy material, said higher order boron species deleteriously affecting the chemical, optical, and electronic properties of the resultant semiconductor alloy material. Therefore, we have found it desirable to be able to fabricate a thin film microcrystalline, p-doped, wide band gap semiconductor alloy material from a gaseous precursor material other than diborane in order to avoid the formation of the polymeric and oligomeric boron species in the plasma.

Additionally, and as referred to hereinabove, Matsuda, et al fail to incorporate fluorine into the matrix of their thin film microcrystalline p-doped semiconductor alloy material. However, as has been shown by the assignee of our invention, fluorine introduced into thin film semiconductor alloy materials having substantially no crystalline inclusions benefically affects the chemical, electrical, and optical properties thereof so as to render those thin film semiconductor alloy materials more clearly equivalent to corresponding single crystalline semiconductor materials. Therefore, we have concluded that it would also be desirable to develop a process by which fluorine could be incorporated into the host matrix of the microcrystalline, p-doped semiconductor alloy material so as to gain all of the aforementioned benefical characteristics of fluorinated amorphous semiconductor alloy materials. In this regard, note that the disclosure of Matsuda, et al is limited to p-doped wide band gap silicon:hydrogen microcrystalline semiconductor alloys. Matsuda, et al do not discuss, describe, or suggest the production of highly-conductive, wide band gap, p-doped, microcrystalline semiconductor alloy materials which incorporate fluorine into the host matrix thereof.

As to the final point enumerated hereinabove, the thin film p-doped microcrystalline semiconductor alloy material fabricated by Matsuda, et at is described, inter alia, by crystalline inclusions of approximately 60 volume percent. Note that the results of Matusda, et al are derived from a film per se, vis-a-vis, a device. And in order to characterize the volume fraction of crystalline inclusions, it is necessary that the film be relatively thick, such as, for example, 1000 angstroms. Further, the volume percent of crystalline inclusions increases with thickness due to nucleation and growth. Therefore, the volume percentage of crystallites in a 100 angstrom thick film fabricated from the material of Matsuda, et al is likely not to have reached the threshold value. In contrast thereto, our thin film, p-doped microcrystalline semiconductor alloy material which includes fluorine has up to 80 volume percent of crystallites. We hypothesize that this difference in volume percent taken in conjunction with the desirable shape of our inclusions, explains the improved nature, relative to relevant electro-optical properties, exhibited by our fluorinated material.

In summary, it may thus be seen that we have discovered one method of fabricating higher quality thin film semiconductor devices than are currently available. We accomplish this fabrication by incorporating fluorine into the host matrix of thin film, wide band gap, p-doped, microcrystalline semiconductor alloy materials. And in order to fabricate said fluorinated, wide band gap, p-doped, microcrystalline semiconductor alloy material in a commerically feasible manner, it is necessary to utilize an economical, high volume, preferably continuous process for the fabrication of said alloys, which process is compatible with processes currently employed for the fabrication of the n-doped and intrinsic layers of thin film semiconductor alloy material so that semiconductor devices can be fabricated in a roll-to-roll system.

II. Microcrystalline Tandem Photovoltaic Devices

We have, as described hereinabove, discovered the vital and synergistic role that microcrystalline, p-doped, wide band gap semiconductor alloy material can play in the production of tandem photovoltaic devices. While we were aware of some of the specific attributes that such wide band gap materials would contribute in the fabrication of photovoltaic devices, it was not until the advent of the instant invention that we discerned the synergistic effect that this incorporation provided in terms of improved photoconversion efficiency. More particularly, narrow band gap, p-doped semiconductor alloy materials assert several undesirable effects when incorporated in a tandem photovoltaic structure. These undesirable effects include (1) a lower built-in potential than can be obtained through the use of materials having a sufficient number of crystalline inclusions to reach the threshold value, (2) lower charge carrier collection than can be obtained through the use of materials having a sufficient number of crystalline inclusions to reach the threshold value, and (3) high optical absorption which causes the subjacent photoactive regions of the tandem structure to be robbed of available light in the manner previously detailed.

We expected the improvements gained (through the use of the wide band gap, p-doped microcrystalline semiconductor material of the instant invention in a tandem photovoltaic structure) in each of the foregoing effects to contribute to increased photoconversion efficiency. However, when we proceeded to add the improvement in efficiency believed possible from each of the individual effects to determine the combined improvement in photoconversion efficiency, the number was well under a $\frac{1}{2}\%$ improvement over the efficiency obtained through the use of p-doped semiconductor alloy material having a volume percentage of crystalline inclusions below the threshold value. Hence, it was not until we actually fabricated a tandem photovoltaic device employing thin film, p-doped microcrystalline semiconductor alloy layers that we realized the tremendous and synergistic effect that the employment of those layers provided. The results are self-explanatory and will be fully described in the Examples found in the Detailed Description of the Drawings. It is only necessary at this point to note that through the use of such wide band gap, p-doped semiconductor alloy materials, we have fabricated a triple tandem photovoltaic device having the world's highest photovoltaic efficiency, an efficiency of greater than 11.2%. As if this result was not enough, that 11.2% efficient photovoltaic device, demonstrates very little photodegradation when exposed to AM-1 conditions.

Due to the tremendous advantages and improvements which we have discovered through the above described experiments, we undertook a thorough prior art search to determine any use by others of microcrystalline p-doped wide band gap semiconductor alloy material in a tandem photovoltaic structure. As a result of that search, the only references which we discovered of a tandem photovoltaic structure formed of microcrystalline p-doped layers were two reports of Nakamura, et al's work, which reports will be discussed in detail hereinbelow.

Nakamura, et al in a first paper entitled "Tandem Type Amorphous Solar Cell", *Technical Digest of the International P.V.S.E.C.*-1, Kobe, Japan (November 1984) pp. 587–590 and in a second paper entitled "Tandem Type Amorphous Solar Cells", *Journal of Non-Crystalline Solids,* Vol. 59 & 60 (1983), pp. 1111–1114, disclose a photovoltaic device formed of three stacked tandem silicon-containing solar cells. The purpose of the first report was to demonstrate the preliminary experimental results obtained during optimization of their p-i-n type triple tandem photovoltaic device fabricated upon a stainless steel substrate. More particularly, the report dealt with (1) the effect of residual impurities from the p-dopant material incorporated into the photoresponsive intrinsic layer of each of the cells and the effect of redistributing said impurities through thermal heat treatment; (2) the effects of a greatly reduced deposition temperature at which the boron doped material is introduced into the p-doped layer and the resultant photovoltaic properties of the device; and (3) the relative stability of p-i-n and n-i-p triple tandem photovoltaic device. The purpose of the second report was to detail (1) the relationship between initial boron profiling and the redistribution of residual impurities to the spectral response; (2) the effect of p-doped layer deposition temperatures on the photovoltaic properties of the p-i-n type cells; and (3) stability testing.

As mentioned hereinabove, the photovoltaic devices of Nakamura, et al are described as either being fabricated from n-i-p or p-i-n type photovoltaic cells in which the n and p doped layers are microcrystalline, i.e., formed of microcrystalline silicon:hydrogen or microcrystalline silicon:germanium:hydrogen. As the learned reader of this application is probably aware from preceding paragraphs of this application, the terms "amorphous", "microcrystalline" and "polycrystalline" represent ambiguous terminology and consequently are subject to a vast number of interpretations by people of ordinary skill in the art. The definitions most commonly used refer to either the degree of short and intermediate range order in the host matrix of the semiconductor alloy material or the volume percentage of the crystalline inclusions contained in that host matrix. The assignee of the instant application has always defined its amorphous material as exhibiting long range disorder irrespective of whether that material exhibits short or intermediate range order or irrespective of the volume percentage of crystalline inclusions.

It must be noted that Nakamura, et al, in both of their reports, fail to provide any definition whatsoever of the manner in which they use the term "microcrystalline". We, in keeping with our long term definition, categorically state and are willing to substantiate, in affidavit form (at such time that affidavits become appropriate) that the material described in the Nakamura, et al papers is not "microcrystalline" as that term is defined in this application. At this point, it is necessary to reemphasize the scope of our definition, i.e., the term "microcrystalline" includes a unique class of amorphous materials which is characterized by a volume fraction of crystalline inclusions, the volume fraction of inclusions being greater than a threshold value at which the onset of substantial changes in certain key parameters such as electrical conductivity, band gap width, and absorption constant occur. The change in the threshold value of these key parameters reflect beneficial material properties which contribute to an improved efficiency in photovoltaic devices fabricated from said p-doped layers. It is due to the fact that we employ these novel p-doped, wide band gap microcrystalline semiconductor alloy layers that we are able to achieve photoconversion efficiencies as high as 11.2%. Again, and in direct contrast to our results, the best efficiencies Nakamura, et al were able to achieve was 8.6% (and that efficiency of 8.6% was reported and achieved approximately two years prior to the date of filing the instant application). Note that the Kobe Conference paper, although published two years after the Non-Crystalline Solids paper, could not even repeat the previously achieved efficiency of 8.6%. Further evidence of the fact that Nakamura, et al's material is not analogous to our microcrystalline p-doped material comes from a review of FIG. 5 of their Kobe Conference paper. FIG. 5 shows a decrease in the optical energy gap while the dark conductivity shows a marked rise. In all measurements of our microcrystalline (as defined herein) p-doped material, the optical energy gap showed a surprising increase along with the increase in the dark conductivity of the material.

More particularly, both Applicants and Nakamura, et al fabricate triple tandem photovoltaic devices composed of three discrete solar cells. The structure of those photovoltaic devices, as viewed from the light incident surface thereof, is ITO/p-doped semiconductor alloy layer/boron-included intrinsic
semiconductor alloy layer/n-doped microcrystalline
semiconductor alloy layer/p-doped microcrystalline
semiconductor alloy layer/boron-included intrinsic
semiconductor alloy layer/n-doped microcrystalline
semiconductor alloy layer/p-doped microcrystalline
semiconductor alloy layer/boron-included intrinsic
semiconductor alloy layer/n-doped microcrystalline
semiconductor alloy layer/stainless steel substrate.

In both cases, the top two solar cells are formed of a silicon:hydrogen alloy and the lowest solar cell is formed of a silicon:germanium:hydrogen alloy. We further state, and are willing to demonstrate by affidavit at the appropriate juncture in the prosecution of this application, that the results obtained by Nakamura, et al are very similar to the results which we obtained prior to the advent of the microcrystalline, wide band gap, p-doped semiconductor alloy material, as that microcrystalline material is defined by the instant application.

Accordingly, while Nakamura, et al refer to their n and p-doped semiconductor alloy material as "microcrystalline", that terminology is, at best, very loosely applied. The n and p-doped layers are not microcrystalline as that term is used in the instant application. We therefore feel confident in claiming we are first to fabricate a tandem photovoltaic device in which the p-doped semiconductor alloy layers are wide band gap and microcrystalline in nature.

These and other objects and advantages of the instant invention will be apparent from the detailed description of the invention, the brief description of the drawings and the claims which follow.

BRIEF SUMMARY OF THE INVENTION

There is disclosed herein a fluorinated, p-doped, microcrystalline semiconductor alloy material. In accordance with a first embodiment of the invention, the semiconductor alloy material comprises a microcrystalline host matrix containing at least silicon, said host matrix having incorporated thereinto at least one density of states reducing element and a p-doping element. The semiconductor is preferably a silicon alloy, the p-dopant is boron and the at least one density of states reducing element includes fluorine. The fluorinated, p-doped, microcrystalline alloy material is characterized by an activation energy of approximately less than 0.05 eV, a conductivity of greater than 1.0 ohms$^{-1}$cm$^{-1}$, a band gap of approximately 2.0 eV, an absorption constant for light of 5500 angstroms of approximately $3 \times 10^4$ cm$^{-1}$, having 0.5 to 5% fluorine incorporated thereinto, and microcrystalline inclusions amounting to greater than 60 volume % in the amorphous matrix.

In other preferred embodiments of the instant invention, the host matrix of the semiconductor alloy material may preferably comprise a silicon:germanium alloy and the microcrystalline semiconductor alloy material may further include hydrogen.

There is also disclosed herein a method of fabricating a fluorinated, p-doped, microcrystalline semiconductor alloy material through the use of a glow discharge deposition process. The method includes the steps of depositing the microcrystalline alloy film upon a substrate through the glow discharge decomposition of a gaseous mixture of at least a semiconductor precursor gas, a dopant precursor gas and a diluent gas; at least one of said precursor gases including fluorine. In a preferred embodiment, the method further includes the step of introducing the gaseous mixture into the glow discharge deposition apparatus in approximately the following proportions: (1) approximately less than 10% of the precursor semiconductor gas, (2) approximately more than 90% of the diluent gas and (3) approximately less than 1% of the precursor p-dopant gas, it being found that the glow discharge decomposition of a gaseous mixture of approximately this composition will produce the wide band gap, fluorinated, microcrystalline semiconductor alloy material of the instant invention.

In a first preferred embodiment of the process of the instant invention, the semiconductor precursor gas is silane, the diluent gas is hydrogen and the dopant precursor gas is boron trifluoride. In another preferred embodiment of the process of the instant invention, the precursor semiconductor gas is silicon tetrafluoride, the diluent gas is hydrogen and the dopant precursor gas is diborane. In still another preferred embodiment of the process of the instant invention, the precursor semiconductor gas is silicon tetrafluoride, the diluent gas is hydrogen and the dopant precursor gas is boron trifluoride. In a yet further preferred embodiment of the instant invention, the precursor semiconductor gas is silicon tetrafluoride and silane, the diluent is hydrogen and the dopant precursor gas is either boron trifluoride or diborane. In yet another preferred embodiment embodiment of the instant invention, the precursor semiconductor gas and the precursor dopant gas are as in the foregoing embodiments but the diluent gas comprises a mixture of hydrogen and an inert gas such as argon.

In accordance with another preferred embodiment of the instant invention, there is provided an electronic device of the type which includes at least one set of p-doped and n-doped semiconductor alloy regions. The improvement in the device comprises the addition of a p-doped semiconductor alloy region which is fabricated of a fluorinated microcrystalline wide band gap semiconductor alloy material. In one particular embodiment of the electronic device, a plurality of sets of p-doped and n-doped regions sandwich a substantially intrinsic semiconductor alloy region so as to form a p-i-n type photovoltaic cell. The p-doped microcrystalline semiconductor alloy material is characterized by a wide band gap so as to minimize losses due to series resistance in the tandem photovoltaic cell.

In accordance with still another preferred embodiment of the instant invention, there is provided a thin film transistor device including therein at least one region formed from a fluorinated, p-doped, microcrystalline semiconductor alloy material. In accordance with still another preferred embodiment of the instant invention, there is provided a CMOS thin film transistor including therein at least one layer of a fluorinated, p-doped, microcrystalline semiconductor alloy material.

Pursuant to yet a further and very important embodiment of the instant invention, there is disclosed a tandem photovoltaic cell structure which comprises a plurality of layers of amorphous alloys deposited one on top of the other in optical series relationship and electrically connected in series with each other. The plurality of layers includes a plurality of doped layers establishing therebetween a plurality of electric field regions for the collection of electron-hole pairs generated in said electric field regions. In this manner, light impinging on the cell structure passes sequentially through the doped layers and the electric field regions with a portion of the light being absorbed in each of the electric field regions. The plurality of doped layers further include a plurality of p-doped layers having a microcrystalline structure characterized by low optical absorption, low activation energy and high electrical conductivity.

DETAILED DESCRIPTION OF THE DRAWINGS

1. The Photovoltaic Cell

Figure 1:
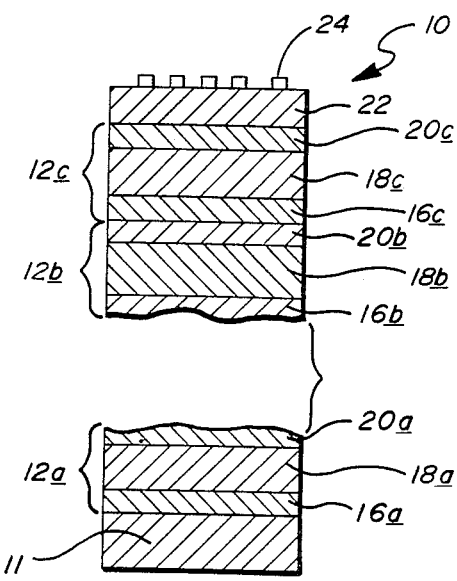
FIG. 1 is a fragmentary, cross-sectional view of a tandem photovoltaic device, said device comprising a plurality of p-i-n type cells, each layer of the cells formed from a semiconductor alloy material.

Referring now to the drawings and particularly to FIG. 1, a photovoltaic cell, formed of a plurality of successive p-i-n layers, each of which includes, preferably, an amorphous thin film semiconductor alloy material, and at least one of said layers formed of the p-doped, wide band gap, microcrystalline semiconductor alloy material of the instant invention, is shown generally by the reference numeral 10.

More particularly, FIG. 1 shows a p-i-n type photovoltaic device such as a solar cell made up of individual p-i-n type cells 12a, 12b, and 12c. Below the lowermost cell 12a is a substrate 11 which may be transparent or formed from a metallic material such as stainless steel, aluminum, tantalum, molybdenum, chrome, or metallic particles embedded within an insulator. Although certain applications may require a thin oxide layer and/or a series of base contacts prior to the application of the amorphous material, for purposes of this application, the term "substrate" shall include not only a flexible film, but also any elements added thereto by preliminary processing. Also included within the scope of the present invention are substrates formed of glass or a glass-like material on which an electrically conductive electrode is applied.

Each of the cells 12a, 12b and 12c is preferably fabricated with a thin film semiconductor body containing at least a silicon alloy. Each of the semiconductor bodies includes an n-type conductivity semiconductor layer 20a, 20b, or 20c; a substantially intrinsic semiconductor layer 18a, 18b, or 18c; and a p-type conductivity semiconductor layer 16a, 16b, or 16c. Note that the intrinsic layer may include traces of n-type or p-type dopant material without forfeiting its characteristic neutrality, hence it may be referred to herein as a "substantially intrinsic layer". As illustrated, cell 12b is an intermediate cell and, as indicated in FIG. 1, additional intermediate cells may be stacked atop the illustrated cells without departing from the spirit or scope of the present invention. Also, although p-i-n photovoltaic cells are illustrated, the methods and materials of this invention may also be and are preferably utilized to produce single or multiple n-i-p cells, p-n cells, Schottky barrier cells, as well as other semiconductor or devices such as diodes, memory arrays, photoconductive devices and the like.

It is to be understood that following the deposition of the semiconductor alloy layers, a further deposition process may be either performed in a separate environment or as a part of a continuous process. In this step, a TCO (transparent conductive oxide) layer 22 is added. An electrode grid 24 may be added to the device where the cell is of a sufficiently large area, or if the conductivity of the TCO layer 22 is insufficient. The grid 24 is adapted to shorten the carrier path and increase the conductive efficiency.

The Multiple Glow Discharge Deposition Chambers

Figure 2:
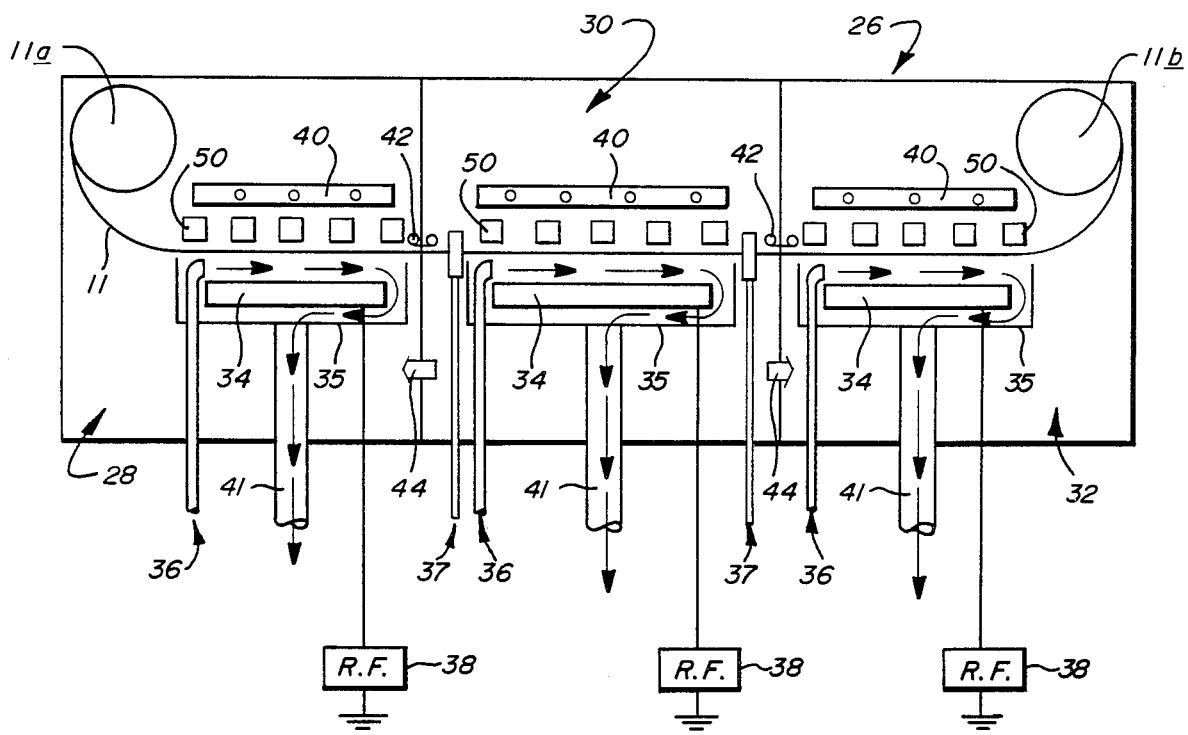
FIG. 2 is a schematic depiction of continuous deposition apparatus structured in accordance with the principles of the instant invention, said apparatus adapted to continuously deposit a plurality of successive, thin film layers of semiconductor alloy material upon a continuously advancing web of substrate material.

Turning now to FIG. 2, a diagrammatic representation of multiple glow discharge deposition apparatus for the continuous production of semiconductor cells is generally illustrated by the reference numeral 26. The apparatus 26 is illustrative of one type of glow discharge deposition system in which the microcrystalline p-doped, wide band gap semiconductor alloy materials of the instant invention may be prepared, it being understood that such materials may also be prepared in other types of continuous and batch vacuum deposition systems as well as by other processes. The deposition apparatus 26 includes a plurality of isolated, dedicated deposition chambers, each chamber of which is interconnected by a gas gate 42 through which (1) sweep gases, and (2) a web of substrate material 11 are adapted to unidirectionally pass.

The apparatus 26 is adapted to mass deposit thin film semiconductor layers of p-i-n configuration onto the large area surface of the web of substrate material 11 which is continually fed therethrough. In order to deposit the layers of semiconductor alloy material required for producing multiple p-i-n type cells, the apparatus 26 includes at least one triad of deposition chambers. Each triad of deposition chambers comprises: a first deposition chamber 28 in which p-type conductivity semiconductor alloy layers is deposited onto the deposition surface of the web of substrate material 11 as the web of substrate material 11 passes therethrough; a second deposition chamber 30 in which an intrinsic semiconductor alloy layer is deposited atop the p-type layer on the deposition surface of the web of substrate material 11 as the substrate 11 passes therethrough; and a third deposition chamber 32 in which an n-type semiconductor alloy layer is deposited atop the intrinsic layer on the deposition surface of the web of substrate material 11 as the web of substrate material 11 passes therethrough. It should be apparent that (1) although, only one triad of deposition chambers has been illustrated, additional triads or additional individual chambers may be added to the apparatus to provide the machine with the capability of producing semiconductor devices having any number and/or sequence of p and n type semiconductor layers; (2) the substrate supply core 11a and the substrate take-up core 11b are shown in the deposition chambers for illustrative purposes only, while in reality the cores would be housed in separate chambers operatively connected to the deposition chambers; (3) although the glow discharge apparatus illustrated herein employs cathodes energized with r.f. power, other sources of electromagnetic energy, such as a.c. power generators, microwave generators and d.c. power generators, may be employed without departing from the spirit of the present invention; and (4) the process gases may be introduced to flow in a direction parallel but opposite to the direction of substrate travel.

Each deposition chamber 28, 30, and 32 of the triad is adapted to deposit a single semiconductor alloy layer, by glow discharge deposition, onto the electrically conductive web of substrate material 11. To that end, each of the deposition chambers 28, 30, and 32 includes: a cathode 34; a shield 35 disposed about each of the cathodes 34; a process gas supply conduit 36; a radio frequency generator or other electromagnetic power source 38; a process gas and plasma evacuation conduit 41; a plurality of transversely extending magnetic elements 50; a plurality of radiant heating elements shown schematically as 40 in FIG. 2; and a gas gate 42 operatively interconnecting the intrinsic deposition chamber to each adjacent dopant chamber. Additionally, an inert sweep gas conduit 37 is disposed on opposed sides of the intrinsic deposition chamber for directing an inert gas toward the dopant deposition chambers.

The supply conduits 36 are operatively associated witn the respective cathodes 34 or other decomposition mechanism to deliver process gas mixtures to the plasma regions, or other decomposition regions created in each deposition chamber between said decomposition mechanism and the web of substrate material 11. The cathode shields 35 are adapted to operate in conjunction with the web of substrate material 11 and the evacuation conduit 41 to confine the process gases within the cathode region of the deposition chambers. To this end, the shielding 35 abuts the cathode 34 in a leak-tight manner.

The radio frequency or other similar type of power generator 38 operates in conjunction with the cathodes 34, the radiant heaters 40 and the grounded web of substrate material 11 to form the plasma by disassociating and recombining the process gases entering the deposition chambers into deposition species and compounds. These species and compounds are then deposited onto the bottom surface of the web of substrate material 11 as semiconductor layers. The web of substrate material 11 is maintained substantially flat by the plurality of rows of magnetic elements 50 which provide an attractive force urging the web of substrate material 11 upwardly, out of its normal sagging path of travel.

To form the photovoltaic device 10 illustrated in FIG. 1, the p-type, wide band gap microcrystalline semiconductor alloy layer of the instant invention is deposited onto the web of substrate material 11 in the p-dopant deposition chamber 28, a substantially intrinsic amorphous semiconductor alloy layer is deposited atop the p-type layer in the intrinsic deposition chamber 30 and an n-type microcrystalline semiconductor alloy layer is deposited atop the intrinsic layer in the n-dopant deposition chamber 32. As a result, in the preferred embodiment, the apparatus 26 deposits at least three semiconductor alloy layers onto the web of substrate material 11 with the intrinsic layer deposited in deposition chamber 30 differing in composition from the layers deposited in deposition chambers 28 and 32 by the absence of large amounts of at least one element which will be referred to as the dopant or doping species. Obviously, the apparatus 26 may be readily modified to produce photovoltaic cells of other combinations or configurations of semiconductor alloy layers. For example, by reversing the direction of travel of the web of substrate material 11, n-i-p configured cells may be manufactured. Also, be adding additional triads of deposition chambers, tandem photovoltaic cells comprising a multiplicity of superposed p-i-n or n-i-p cells may be manufactured.

III. The Microcrystalline, P-Doped Wide Band Gap Semiconductor Alloy Material The semiconductor alloy material of the instant invention is a p-doped microcrystalline semiconductor alloy fabricated from a host matrix of silicon which further includes hydrogen, with or without the addition of fluorine, as well as p-dopant material such as boron. We found that said p-doped, wide band gap, microcrystalline semiconductor alloy material may be readily fabricated by glow discharge deposition, provided proper gaseous precursor materials are employed and proper deposition conditions are maintained. Great care must be taken in the introduction of gaseous precursor materials because of the many competing chemical reactions which can occur in the plasma generated in a glow discharge system, such as the plasma generated for the preparation of the thin semiconductor alloy films of the instant invention. Some of these reactions favor the growth or deposition of the semiconductor alloy material, while other reactions favor the etching away of that deposited semiconductor alloy material. Applicants have found that in order to fabricate the microcrystalline semiconductor alloy material of the instant invention it is necessary to control said competing chemical reactions so as to control the relative rates of etching and deposition of that semiconductor alloy material. In accordance with the principles enumerated herein, we discovered that if the rate of growth of the semiconductor alloy species formed in the glow discharge plasma greatly exceeds the rate of etching of the depositing materials, a semiconductor alloy film not possessing the required volume percentage of crystalline inclusions necessary to reach the threshold value will be deposited onto the substrate; and obviously, if the rate of etching of the depositing species of semiconductor alloy material far exceeds the rate of deposition, no semiconductor alloy film will be deposited. It is only when the growth of the semiconductor alloy material and the etching of that material occur at approximately similar rates, that microcrystalline semiconductor alloy material with the required volume percentage of crystalline inclusions required to reach the threshold value will be deposited.

In a typical glow discharge deposition process for the preparation of films of semiconductor alloy material, a process gas mixture is subjected to the effects of an electromagnetic field, which electromagnetic field is developed between the cathode 34 and the web of substrate material 11 (described in detail hereinabove with reference to FIG. 2). A typical process gas mixture employed and introduced into the plasma region in the practice of the instant invention comprises (1) a gaseous precursor semiconductor material which serves to provide the semiconductor element or elements of the host matrix, (2) one or more gaseous density of states reducing elements which serve to reduce undesired electronic states in the band gap of the semiconductor alloy and thereby improve the electrical, chemical and optical properties of the resultant alloy, and (3) a gaseous precursor p-dopant material which introduces the p-dopant element into the host matrix of the semiconductor alloy material; said gaseous precursor mixture referred to collectively herein as the reacting species. The process gas mixture also includes a gaseous diluent, which may comprise a single component or a mixture of components, and which diluent serves to dilute the reacting species so as to introduce the optimum concentration and combination of said reacting species into the glow discharge plasma. Furthermore, in some cases the diluent gas is also adapted to assist in the actual decomposition and recombinatiion of the reacting species, and in still other cases the diluent gas is also adapted to act as a density of states reducing element.

Applicants have found that in the embodiment of the instant invention wherein high quality microcrystalline, p-doped, wide band gap, fluorinated, hydrogenated semiconductor alloys are deposited, it is necessary to employ a gaseous precursor mixture which is highly dilute; that is to say, a gaseous precursor mixture in which the reacting species of gaseous precursor material are present in relatively low concentration relative to the diluent gas. When such a dilute gaseous precursor mixture is utilized in a glow discharge deposition process, the deposition parameters can be controlled so as to insure that the rates of etching and growth are substantially similar and the deposition of a microcrystalline semiconductor alloy material results.

Typical process gas mixtures which can be employed in the practice of the instant invention to deposit a wide band gap, p-doped, fluorinated, hydrogenated microcrystalline semiconductor alloy material comprise from 0.1 to 10% of a gaseous precursor semiconductor alloy material such as silane, or silicon tetrafluoride, alone or in combination with germane and 0.02 to 0.4% of a gaseous dopant material such as boron trifluoride or diborane diluted in a gaseous diluent material such as hydrogen, argon or a mixture of the two. In other words, the ratio of boron trifluoride to silane is preferably in the range of about 40% while the ratio of diborane to silane is preferably in the range of 4%. The typical deposition parameters which can be employed are a substrate temperature of about ambient 275° C. (a preferred range of 150° C.–225° C.), a pressure of about 0.5–2.0 torr, and a relatively high r.f. power density of greater than about 300 milliwatts or 1.5 watts per centimeter squared.

One preferred microcrystalline semiconductor alloy material of the instant invention comprises an alloy formed of silicon:hydrogen:fluorine doped with boron. Because of the fact that the semiconductor alloy material is microcrystalline, it may be readily and efficiently doped so as to achieve an extremely low activation energy, typically in the range of about 0.05 eV. According to the principles of the instant invention, examples of such p-doped, wide band gap, highly conductive, microcrystalline, fluorinated, hydrogenated semiconductor alloy material were prepared by the procedures outlined in the following examples. Note that no examples are provided herein relative to the fabrication of non-fluorinated, p-doped, microcrystalline semiconductor alloy material because the fabrication of such non-fluorinated material per se does not constitute part of the inventive concept disclosed herein. This, however, is to be distinguished from the use of such microcrystalline material, as defined herein, in a tandem photovoltaic structure, which use constitutes a very important inventive concept of the instant application.

A gaseous precursor mixture comprising 0.20% silane, 0.08% boron trifluoride and 99.72% hydrogen was introduced into a glow discharge deposition apparatus, generally similar to the p-dopant chamber 28 of the deposition apparatus 26 illustrated in and described with respect to FIG. 2, which p-dopant chamber was maintained at a pressure of approximately 0.6 torr. The substrate was heated to a temperature of approximately 225° C. and radio frequency energy of 13.56 MHz at a power of 30 watts was applied to the cathode 34 of the deposition apparatus 26 so as to initiate a glow discharge plasma therein. The aforementioned deposition conditions were maintained for about 30 minutes, at which time the electromagnetic energy was terminated and the deposition chamber raised to atmospheric pressure. The semiconductor alloy film thus deposited was approximately 600 angstroms thick. Measurements made via Raman spectroscopy and transmission electron microscopy confirm that the sample was indeed microcrystalline and that the crystallite size was within the range of 50–100 angstroms. The volume percentage of the microcrystalline-silicon inclusions was estimated to be greater than about 80%. This is well above the percolation threshold at which threshold value certain key electro-optical characteristics show marked changes. This explains the reason that the dark conductivity of the deposited microcrystalline semiconductor alloy was so high. The thus prepared microcrystalline p-doped silicon:hydrogen:fluorine alloy had a dark conductivity of approximately 5.0 ohm$^{-1}$ centimeters$^{-1}$, as compared to (1) a conductivity of approximately $10^{-4}$ to $10^{-3}$ ohm$^{-1}$ centimeter$^{-1}$ for a corresponding p-doped, silicon:fluorine:hydrogen alloy having volume percentage of crystalline inclusions below the threshold value; and (2) as compared to a conductivity of approximately 0.1 ohm$^{-1}$ centimeter$^{-1}$ for the corresponding non-fluorinated microcrystalline silicon:hydrogen alloy prepared utilizing diborane as the precursor gaseous source of p-doped material in Matsuda, et al. The activation energy of the p-doped microcrystalline silicon alloy was less than about 0.05 eV compared to 0.4 to 0.3 eV for said corresponding amorphous p-doped, silicon:fluorine:hydrogen alloy sample. The optical gap of said sample was 2.0 eV as compared to 1.6 eV for a corresponding silicon:hydrogen:fluorine alloy sample having a volume percentage of crystalline inclusions below the threshold value; and as compared to 1.8 eV for the corresponding p-doped, non-fluorinated, microcrystalline silicon:hydrogen alloy of Matusda, et al. The absorption constant at 5500 angstroms of light was measured to be about $3 \times 10^4$ cm$^{-1}$ as compared to $1 \times 10^5$ cm$^{-1}$ for the p-doped silicon:hydrogen:fluorine alloy sample having a volume percentage of crystalline inclusions below the threshold value. Finally, about 3.5% of fluorine was incorporated into the host matrix. Note that in all of the depositions outlined herein, the percentage of fluorine incorporated into the host matrix of the semiconductor alloy material was between 0.5 to 5.0% and typically greater than 1.0%.

EXAMPLE II

In this example two photovoltaic cells of an n-i-p configuration were prepared. The two cells were identical insofar as they each consisted of a reflective stainless steel substrate having a layer of n-doped silicon alloy material deposited thereupon, a layer of intrinsic silicon semiconductor alloy material deposited upon the n-doped layer so as to be generally coextensive therewith. The first one of the samples then had a layer of p-doped, silicon:fluorine:hydrogen alloy material generally similar in structure and properties to the p-doped layer characterized in Example 1 as having a volume percentage of crystalline inclusions below the threshold value, deposited atop the layer of intrinsic semiconductor alloy material. The second one of the samples had a layer of microcrystalline p-doped silicon:fluorine:hydrogen alloy material, which material was generally similar in structure and properties to the layer of microcrystalline p-doped semiconductor alloy material characterized in Example I, deposited atop of and generally coextensively with the layer of intrinsic semiconductor alloy material. The two photovoltaic cells thus fabricated were subjected to simulated solar illumination of approximately AM-1 intensity. The photoconversion parameters of the two photovoltaic cells are summarized in Table 1 below.

TABLE 1

|  | Layer of Microcrystalline p-doped silicon:fluorine:hydrogen alloy | Layer of Amorphous p-doped silicon:fluorine:hydrogen alloy |
|---|---|---|
| Voc | 0.952 V | 0.72 V |

TABLE 1-continued

| | Layer of Microcrystalline p-doped silicon:fluorine:hydrogen alloy | Layer of Amorphous p-doped silicon:fluorine:hydrogen alloy |
|---|---|---|
| Jsc | 13.895 mA/cm$^2$ | 12.0 mA/cm$^2$ |
| Fill factor | .712 | .58 |
| Efficiency | 9.4% | 5.0% |

As may be seen from the foregoing Table, the use of the microcrystalline, p-doped silicon:fluorine:hydrogen alloy layer improves photovoltaic cell performance in terms of open circuit voltage, short circuit current, and fill factor, and hence the cell shows a drastic improvement in terms of photoconversion efficiency.

EXAMPLE III

In this example, a relatively thin n-i-p type photovoltaic cell was formed upon a stainless steel substrate. This photovoltaic cell differs from the cell illustrated in and described with reference to FIG. 2 insofar as it was relatively thin, i.e. only approximately 1000 angstroms in total thickness. This relatively thin photovoltaic cell was specifically designed to be generally similar to thickness and chemical composition to the top cell utilized in tandem photovoltaic devices and was therefore fabricated to show the feasibility of utilizing the microcrystalline, p-doped, wide band gap, semiconductor alloy material of the instant invention as the p-doped layer in such a tandem photovoltaic device. The semiconductor alloy layers were all glow discharge deposited, pursuant to the parameters set forth in the foregoing Examples. We found that the relatively thin n-i-p photovoltaic cell thus produced generated an open circuit voltage of about 0.936 volts and a short circuit current of about 9.548 mA/cm$^2$ (the relatively low short circuit current output of the photovoltaic cell being attributable to the thinness of that cell). The fill factor of the photovoltaic cell was about 0.706 and the maximum power output of the one square centimeter cell was about 6.312 mW/cm$^2$.

EXAMPLE IV

Figure 3:
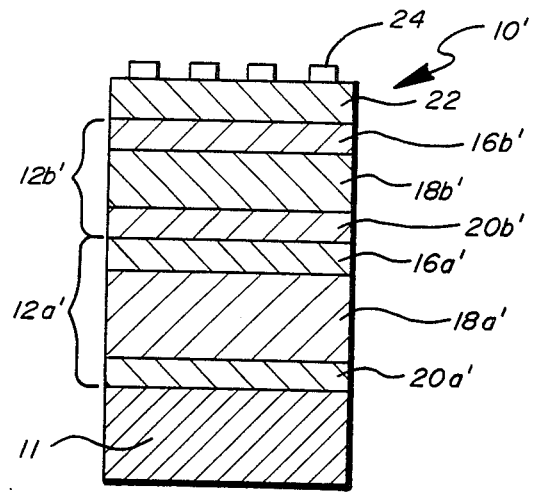
FIG. 3 is a cross-sectional view of a dual band gap tandem photovoltaic device similar to the device of FIG. 1, said device comprising two n-i-p cells; the p-doped layers of each cell formed from the fluorinated, wide band gap, microcrystalline semiconductor alloy material of the instant invention.

In this example, and with specific reference to FIG. 3, a tandem photovoltaic device is shown generally by the reference numeral 10'. The tandem photovoltaic device 10' is formed of two stacked n-i-p photovoltaic cells, 12a' and 12b', each cell incorporating the layer of fluorinated microcrystalline, p-doped, wide band gap semiconductor alloy material, 16a' and 16b', respectively, which forms one aspect of the instant invention.

More specifically, the photovoltaic device 10 was formed by depositing a first n-doped semiconductor alloy (silicon:hydrogen:phosphorous) layer 20a' of about 250 angstroms thickness onto a stainless steel substrate 11, a first intrinsic semiconductor alloy (silicon:fluorine:hydrogen:boron (in trace amounts)) layer 18a' of about 3500 angstroms thickness atop the n-doped layer, a first p-doped microcrystalline semiconductor alloy (silicon:fluorine:hydrogen:boron) layer 16a' of about 100 angstroms thickness atop the intrinsic layer, a second n-doped semiconductor alloy (silicon:hydrogen:phosphorous) layer 20b' of about 100 angstroms thickness atop the first p-doped layer, a second intrinsic semiconductor alloy (silicon:fluorine:hydrogen:boron (in trace amounts)) layer 18b' of about 1000 angstroms thickness atop the second n-doped layer, a second p-doped microcrystalline semiconductor alloy (silicon:fluorine:hydrogen:boron) layer 16b' of about 75 angstroms thickness atop the second intrinsic layer, an ITO layer 22 of about 500 angstroms thickness atop the second p-doped layer and grid fingers 24 atop the ITO layer.

Note that the semiconductor alloy layers were glow discharge deposited from precursor gas mixtures of (1) silane, hydrogen, and phosphine to form the n-doped semiconductor alloy layers; (2) silane, hydrogen, and trace amounts of boron trifluoride to form the intrinsic semiconductor alloy layer and (3) silane, hydrogen and boron trifluoride to form the p-doped semiconductor alloy layers.

Although, in an optimized tandem photovoltaic device, each one of the plurality of photovoltaic cells thereof are preferably fabricated to be responsive to different portions of the solar spectrum, in this example of two photovoltaic cells 12a' and 12b' were formed of semiconductor alloy materials having generally similar band gaps. The object of the fabrication of this particularly configured (same band gap) photovoltaic device was only to demonstrate that additional layers of semiconductor alloy material may be disposed atop the fluorinated, p-doped, wide band gap, microcrystalline semiconductor alloy material of the instant invention without adversely affecting the interface developed therebetween. The two stacked n-i-p type photovoltaic cells 12a' and 12b' of this example were generally similar to the p-i-n photovoltaic cells 12a and 12b of FIG. 1. Open circuit voltage of the tandem photovoltaic cell was about 1.821 volts and the fill factor was about 0.725, thereby indicating that a good tunnel junction was present between the layer of p-doped, wide band gap microcrystalline semiconductor alloy material 16a' of the lower photovoltaic cell 12a' and the layer of n-doped semiconductor alloy material 20b' of the upper photovoltaic cell 12b'. If interface problems had occured therebetween, it would be expected that the series resistance of the tandem photovoltaic cell 10' would be high, and the open circuit voltage and the fill factor thereof would be low. Furthermore, when a short circuit current versus open circuit voltage plot (known to those well versed in the art as an I-V plot) is sketched for such tandem photovoltaic devices, a low quality junction between the upper and lower photovoltaic cells comprising the tandem photovoltaic device is manifested as a kink in the first quadrant of the otherwise smoothly rising I-V plot. No such kink was present for the tandem photovoltaic device of the instant example. While the short circuit current of the tandem photovoltaic device was only about 6.654 mA/cm$^2$, the short circuit current was expected to be low, owing to the fact that the two photovoltaic cells, 12a' and 12b', from which the photovoltaic device 10' was fabricated had similar band gaps. Therefore, most of the light was captured in the upper photovoltaic cell 12b' and the lower photovoltaic cell 12a' was unable to generate much current. Despite the relatively low short circuit current, the photovoltaic device 10' operated at a photoconversion efficiency of about 8.8%.

EXAMPLE V

In this example, an n-i-p-type photovoltaic device 10' was fabricated identical to the device described with respect to FIG. 3, except that the lower photovoltaic cell 12a' thereof was glow discharge deposited with a narrow band gap intrinsic semiconductor alloy layer of silicon:germanium:fluorine:hydrogen:boron (in trace amounts) 18a'. It is this type of narrow band gap lower photovoltaic cell 12a' which would be utilized in conjunction with a superposed wider band gap photovoltaic cell 12b' such as the aforedescribed silicon:fluorine:hydrogen:boron (in trace amounts) alloy material to fabricate an efficient dual tandem photovoltaic device. The narrow band gap photovoltaic cell 12a' was fabricated by a glow discharge process generally similar to that process described with reference to FIG. 1; however, a gaseous mixture of silane, germane, hydrogen, and boron trifluoride was employed for the deposition of the layer of intrinsic silicon:germanium alloy material. The n-doped and p-doped layers of semiconductor alloy material were generally similar to those described in the foregoing examples. The lower cell 12' thus produced had an open circuit voltage of about 0.739 volts, the short circuit current was about 18.704 mA/cm², the efficiency was about 8.516, and the fill factor was 0.616.

EXAMPLE VI

Figure 4:
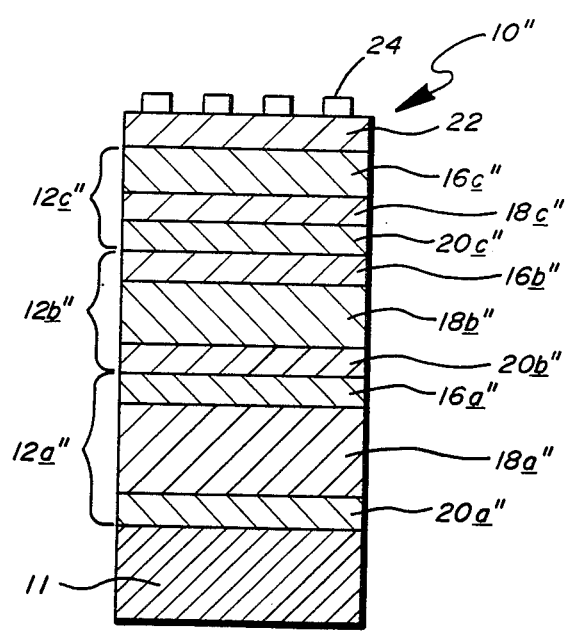
FIG. 4 is a cross-sectional view of a dual band gap tandem photovoltaic device similar to the device of FIG. 1, said device comprising three n-i-p cells; the p-doped layers of each cell formed from the wide band gap, microcrystalline semiconductor alloy material of the instant invention.

In this example, and with specific reference to FIG. 4, a tandem photovoltaic device is shown generally by the reference numeral 10". The tandem photovoltaic device 10" is formed of three stacked n-i-p photovoltaic cells, 12a", 12b", and 12c", each cell incorporating the layer of fluorinated, microcrystalline, p-doped, wide band gap semiconductor alloy material 16a", 16b", and 16c" respectively, of the instant invention.

More specifically, the photovoltaic device 10" is formed by depositing a first n-doped semiconductor alloy (silicon:hydrogen:phosphorous) layer 20a" of about 300 angstroms thickness onto a stainless steel substrate 11, a first intrinsic semiconductor alloy, (silicon:germanium:hydrogen) layer 18a of about 3500 angstroms thickness atop the n-doped layer, a first p-doped semiconductor alloy (silicon:fluorine:hydrogen:boron) layer 16a" of about 100 angstroms thickness atop the intrinsic layer, a second n-doped semiconductor alloy (silicon:hydrogen:phosphorous) layer 20b" of about 100 angstroms thickness atop the first p-doped layer, a second intrinsic semiconductor alloy (silicon:hydrogen) layer 18b" of about 2000 angstroms thickness atop the second n-doped layer, a second p-doped semiconductor alloy, (silicon:fluorine:hydrogen:boron) layer 16b" of about 100 angstroms thickness atop the second intrinsic layer, a third n-doped semiconductor alloy (silicon:hydrogen:phosphorous) layer 20c" of about 100 angstroms thickness atop the second p-doped layer, a third intrinsic semiconductor alloy (silicon:hydrogen) layer 18c" of about 500 angstroms thickness atop the third n-doped layer, a third p-doped semiconductor alloy (silicon:fluorine:hydrogen:boron) layer 16c" of about 80 angstroms thickness atop the third intrinsic layer, an ITO layer 22 of about 600 angstroms thickness atop the second p-doped layer and grid fingers 24 atop the ITO layer. Again note that the semiconductor alloy layers were glow discharge deposited from precursor gas mixtures of (1) silane, hydrogen, phosphine, and argon to form the n-doped semiconductor alloy layers; (2) silane, hydrogen, germane, and argon to form the lowest intrinsic semiconductor alloy layer, (3) silane, hydrogen, and argon to form the upper intrinsic semiconductor alloys layer and (4) silane, hydrogen, and boron trifluoride to form the p-doped semiconductor alloy layers. Further note that the lower intrinsic semiconductor alloy layer is graded so that the upper one hundred angstroms thereof is deposited from the aforementioned precursor semiconductor alloy mixture minus germane so as to profile that layer. In this manner, the first deposited cell 12a" has a band gap of about 1.5 eV and the second and third cells, 12b" and 12c", respectively, have band gaps of about 1.7 eV.

Again, although, in an optimized photovoltaic device, each one of the plurality of photovoltaic cells thereof would be fabricated to be responsive to different portions of the solar spectrum, in this example, only the lower photovoltaic cell 12a" is formed of semiconductor alloy material having a band gap different from the band gap of the upper two photovoltaic cells 12b" and 12c". The three stacked n-i-p type photovoltaic cells 12a", 12b", and 12c– of this example were generally similar to the p-i-n photovoltaic cells 12a' and 12b' of FIG. 3. The open circuit voltage of the triple tandem photovoltaic cell 10" was about 2.501 volts, the fill factor was about 0.701, the short circuit current of the cell 10" was about 6.395 milliamps per centimeter squared and the efficiency was a world's record 11.208%. Furthermore, owing, inter-alia, to the thinness of the photoactive layers and the high built in potential provided by the microcrystalline, p-doped semiconductor material of the instant invention, photoinduced degradation is expected to be well under 10% after 1000 hours of exposure to AM1 condition (expectations are based upon testing of other similarly configured and compositionally fabricated tandem photovoltaic devices).

EXAMPLE VII

Figure 5:
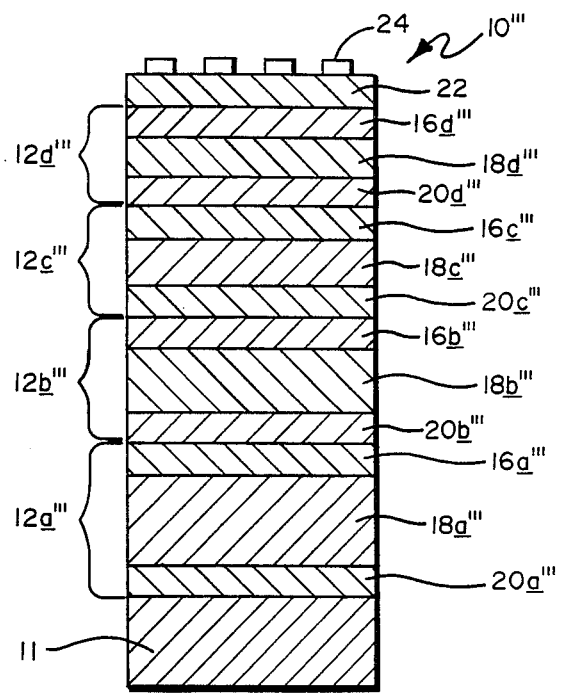
FIG. 5 is a cross-sectional view of a dual band gap tandem photovoltaic device similar to the device of FIG. 1, said device comprising four n-i-p cells; the p-doped layers of each cell found from the wide band gap, microcrystalline semiconductor alloy material of the instant invention.

In this example, and with specific reference to FIG. 5, a tandem photovoltaic device is shown generally by the reference numeral 10"'. The tandem photovoltaic device 10"' is formed of four stacked n-i-p photovoltaic cells, 12a"', 12b"', 12c"' and 12d"', each cell incorporating the layer of fluorinated, microcrystalline, p-doped, wide band gap semiconductor alloy material 16a"', 16b"', 16c"', and 16d"', respectively, of the instant invention.

More specifically, the "quad" tandem photovoltaic device 10"' is formed by depositing a first n-doped semiconductor alloy (silicon:hydrogen:phosphorous) layer 20a"' of about 350 angstroms thickness onto a stainless steel substrate 11, a first intrinsic semiconductor alloy (silicon:germanium:hydrogen) layer 18a"' of about 3500 angstroms thickness atop the n-doped layer, a first p-doped microcrystalline semiconductor alloy (silicon:fluorine:hydrogen:boron) layer 16a"' of about 100 angstroms thickness atop the intrinsic layer, a second n-doped semiconductor alloy, (silicon:hydrogen:phosphorous) layer 20b"' of about 100 angstroms thickness atop the first p-doped layer, a second intrinsic semiconductor alloy (silicon:hydrogen) layer 18b"' of about 3000 angstroms thickness atop the second n-doped layer, a second microcrystalline p-doped semiconductor alloy, (silicon:fluorine:hydrogen:boron) layer 16b"' of about 100 angstroms thickness atop the second intrinsic layer, a third n-doped semiconductor alloy (silicon:hydrogen:phosphorous) layer 20c"' of about 100 angstroms thickness atop the second p-doped layer, a third intrinsic semiconductor alloy, (silicon:hydrogen) layer 18c"' of about 1000 angstroms thickness atop the third n-doped layer, a third p-doped microcrystalline semiconductor alloy (silicon:fluorine:hydrogen:boron) layer 16c"' of about 100 angstroms thickness atop the third intrinsic layer, a fourth n-doped semiconductor alloy, (silicon:hydrogen:phosphorous) layer 20d"' of about 100 angstroms thickness atop the third p-doped layer, a fourth intrinsic semiconductor alloy (silicon:hydrogen) layer 18d''' of about 350 angstroms thickness atop the fourth n-doped layer, a fourth p-doped microcrystalline semiconductor alloy (silicon:fluorine:hydrogen:boron) layer 16d''' of about 100 angstroms thickness atop the fourth intrinsic layer, an ITO layer 22 of about 600 angstroms thickness atop the fourth p-doped layer, and grid fingers 24 atop the ITO layer.

Again note that the semiconductor alloy layers were glow discharge deposited from precursor gas mixtures of (1) silane, hydrogen, phosphine, and argon to form the n-doped semiconductor alloy layers; (2) silane, hydrogen, germane, and argon to form the lowest intrinsic semiconductor alloy layer, (3) silane, hydrogen, and argon to form the upper intrinsic semiconductor alloy layers and (4) silane, hydrogen, and boron trifluoride to form the p-doped semiconductor alloy layers. Further note that the lower intrinsic semiconductor alloy layer is graded so that the upper one hundred angstroms thereof is deposited from the aforementioned precursor semiconductor alloy mixture minus germane so as to profile that layer. In this manner, the first deposited cell 12a''' has a band gap of about 1.5 eV and the second, third, and fourth cells, 12b'', 12c''', and 12d''' respectively, have band gaps of about 1.7 eV.

Again, although, in an optimized photovoltaic device, each one of the plurality of photovoltaic cells thereof would be fabricated to be responsive to different portions of the solar spectrum, in this example, only the lower photovoltaic cell 12a''' is formed of semiconductor alloy material having a band gap different from the band gap of the upper three photovoltaic cells. The four stacked n-i-p type photovoltaic cells 12a''', 12b''', 12c''', and 12d''' of this example were generally similar to the p-i-n photovoltaic cells 12a'', 12b'', and 12c'' which were stacked to form the photovoltaic device of FIG. 4. The open circuit voltage of the quad tandem photovoltaic cell 10''' was about 3.349 volts, the fill factor was about 0.709, the short circuit current was about 3.203 milliamps per centimeter squared and the efficiency was about 7.610. Furthermore, owing, inter-alia, to the thinness of the photoactive layers and the high built-in potential provided by the microcrystalline, p-doped semiconductor material of the instant invention, photoinduced degradation was virtually nonexistent, the cell still operating at 97% of its initial photoconversion effeciency despite over 1500 hours exposure to AM1 conditions.

Other Electronic Devices

In addition to the fabrication of highly efficient photovoltaic devices, the p-doped, wide band gap, microcrystalline semiconductor alloy material of the instant invention may be advantageously employed in the fabrication of other types of electronic devices. For example, memory arrays comprising a plurality of thin film diodes will have the performance thereof enhanced in a manner somewhat analogous to the manner in which the efficiency of the photovoltaic devices were enhanced as a result of the incorporation of the microcrystalline material thereonto. Also, thin film transistors such as field effect transistors, as well as arrays of transistors, including CMOS transistors would similarly benefit by incorporating the p-doped microcrystalline material.

In summary then, the p-doped, microcrystalline semiconductor alloy material of the instant invention exhibits high electrical conductivity and may therefore be efficiently doped to provide low activation energies and substantially degenerate behavior. Because of that high conductivity, the ease with which the microcrystalline material can establish ohmic contact to a wide variety of the semiconductor alloy materials, and the fact that p-doped microcrystalline material can be fabricated in a continuous process which is compatible with the process for fabricating the other layers of amorphous semiconductor alloy material, the microcrystalline semiconductor alloy material of the instant invention may be advantageously employed to form contacts, circuit lines, bus bars and other types of conductive members employed in the manufacture of integrated circuits.

As mentioned in the foregoing description of the invention, an n-i-p solar cell configuration, i.e., substrate/n-doped layer/intrinsic layer/p-doped layer, is actually preferred. This is because (1) the p-doped semiconductor alloy layer can now be fabricated to have a wide band gap so as to pass incident light to the intrinsic semiconductor alloy layer of the photovoltaic cell and (2) the maximum amount of light absorption and hence charge carrier generation occurs at the top of the intrinsic semiconductor alloy layer of the cell; therefore, the charge carriers of poorest mobility (the holes) are then generated closest to the collection electrode thereof and recombination is held to a minimum.

In recapitulation, we not only have developed a new and useful fluorinated, p-doped, microcrystalline semiconductor alloy material, but we have also determined the synergism present in the use of a p-doped microcrystalline semiconductor alloy material, such as that material disclosed by the instant invention, in a tandem photovoltaic device structure.

The foregoing description is merely meant to be illustrative of the instant invention, and not as a limitation upon the practice thereof. Numerous variations and modifications of the disclosed embodiments of the instant invention are possible. It is the following claims, including all equivalents, which define the scope of the instant invention.

What is claimed is:
1. A tandem photovoltaic structure comprising:
   a. a plurality of n stacked solar cells, where n is an integer greater than 1;
   b. each cell including a plurality of layers of amorphous semiconductor alloy material in optical and electrical series relationship;
   said plurality of layers of each cell including therein oppositely doped layers establishing therebetween an electric field region for the collection of electron-hole pairs generated therein, wherein light impinging on said structure passes sequentially through said doped layers and said electric field regions with a portion of the light being absorbed in each of said electric field regions; and
   said plurality of layers including a p-doped amorphous silicon alloy layer, the improvement comprising in combination:
   said p-doped amorphous silicon layer being microcrystalline in that said p-doped layer is characterized by a volume fraction of crystalline inclusions greater than a threshold value at which substantial changes in electrical parameters including conductivity and activation energy occur; said volume fraction being greater than about 16–19% in a 3-D model and about 45% in a 2-D model; and said p-doped microcrystalline layer exhibiting low optical absorption, low activation energy, high electrical conductivity and having an optical gap wider than the optical gap of the corresponding amorphous silicon alloy material.

2. A structure as in claim 1, wherein all of the doped layers are microcrystalline.

3. A structure as in claim 2, wherein the deposited layers are operatively disposed to form a plurality of n-i-p solar cells.

4. A structure as in claim 3, wherein the deposited layers are stacked to form three n-i-p cells.

5. A structure as in claim 4, wherein the deposited layers are stacked to form four n-i-p cells.

6. A structure as in claim 3, wherein the semiconductor in the the layers is silicon and the dopant in the p-doped layers is boron.

7. A structure as in claim 6, wherein the p-doped layers further include hydrogen.

8. A strucuture as in claim 7, wherein the p-doped layers further include fluorine.

9. A structure as in claim 7, wherein the p-doped layers are characterized by an activation energy of less than approximately 0.05 eV.

10. A structure as in claim 7, wherein the p-doped layers are characterized by a conductivity of greater than $0.5$ ohms$^{-1}$-cm$^{-1}$.

11. A structure as in claim 7, wherein the p-doped layers are characterized by an optical gap of approximately 2.0 eV.

12. A structure as in claim 7, wherein the p-doped layers are characterized by an absorption constant at 5500 angstroms of less than about $3 \times 10^4$ cm$^{-1}$.

13. A structure as in claim 1, wherein the deposited layers are stacked to form a pair of n-i-p solar cells characterized by an open circuit voltage of at least 1.8 volts, a short circuit current of at least 6.5 milliamperes per square centimeter, and a fill factor of at least 0.7.

14. A structure as in claim 1, wherein the deposited layers are stacked to form three n-i-p solar cells characterized by an open circuit voltage of at least 2.3 volts, a short circuit current of at least 6.0 milliamperes per square centimeter, and a fill factor of at least 0.7.

15. A structure as in claim 1, wherein the deposited layers are stacked to form four n-i-p solar cells characterized by an open circuit voltage of at least 3.2 volts, a short circuit current of at least 3.0 milliamperes per square centimeter, a fill factor of 0.7, and less than 5% degradation after being subjected to 1500 hours of AM1 exposure.

16. A structure as in claim 1, wherein the microcrystalline material includes crystalline inclusions amounting to at least about 16–19% by volume in the amorphous network.

17. A structure as in claim 1, wherein the microcrystalline material includes crystalline inclusions amounting to at least about 45% by volume in the amorphous network.

18. A structure as in claim 1, wherein the microcrystalline material includes crystalline inclusions amounting to at least about 80% by volume in the amorphous network.

19. A tandem photovoltaic structure comprising:
a. a plurality of n stacked solar cells, where n is an integer greater than 1;
b. each cell including a plurality of layers of amorphous semiconductor alloy material in optical and electrical series relationship;
said plurality of layers of each cell including therein oppositely doped layers establishing therebetween an electric field region for the collection of electron-hole pairs generated therein, wherein light impinging on said structure passes sequentially through said doped layers and said electric field regions with a portion of the light being absorbed in each of said electric field regions; and
said plurality of layers including a p-doped amorphous silicon alloy layer, the improvement comprising in combination:
said p-doped layer being microcrystalline and characterized by low optical absorption, low activation energy, high electrical conductivity, and having an optical gap wider than the optical gap of the corresponding amorphous silicon alloy material;
said p-doped layer further characterized in that, as incorporated in said photovoltaic structure, said structure exhibits at least one of the following properties under AM-1 illumination:
(1) a $V_{oc}$ of about 0.93 or greater for a single p-i-n amorphous silicon alloy solar cell of an n-cell tandem; or
(2) a $V_{oc}$ of about 2.5 or greater when the structure is a tandem formed of three stacked p-i-n amorphous silicon alloy cells; or
(3) an efficiency of about 11% or greater when the structure is a tandem formed of three stacked p-i-n amorphous silicon alloy cells; or
(4) a $V_{oc}$ of about 0.73 or greater for a single p-i-n amorphous silicon-germanium alloy solar cell of an n-cell tandem; or
(5) a $V_{oc}$ of about 3.3 or greater when the structure is a tandem formed of four stacked p-i-n amorphous silicon and silicon-germanium alloy cells; or
(6) an efficiency of about 7.6% or greater when the structure is tandem formed of four stacked p-i-n amorphous silicon and silicon-germanium alloy cells.

* * * * *

UNITED STATES PATENT AND TRADEMARK OFFICE
Certificate

Patent No. 4,609,771                 Patented September 2, 1986

On petition requesting issuance of a certificate for correction of inventorship pursuant to 35 USC 256, it has been found that the above-identified patent, through error and without any deceptive intent, improperly sets forth the inventorship. Accordingly, it is hereby certified that the correct inventorship of this patent is Subhendu Guha, James Kulman, and Stanford R. Ovshinsky.

Signed and Sealed this 3rd Day of February, 1987.

BRADLEY R. GARRIS,
*Office of the Deputy Assistant
Commissioner for Patents.*